(12) United States Patent
Ando et al.

(10) Patent No.: US 10,672,881 B2
(45) Date of Patent: Jun. 2, 2020

(54) FERROELECTRIC GATE DIELECTRIC WITH SCALED INTERFACIAL LAYER FOR STEEP SUB-THRESHOLD SLOPE FIELD-EFFECT TRANSISTOR

(71) Applicant: INTERNATIONAL BUSINESS MACHINES CORPORATION, Armonk, NY (US)

(72) Inventors: Takashi Ando, Tuckahoe, NY (US); Martin M. Frank, Dobbs Ferry, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/608,480

(22) Filed: May 30, 2017

(65) Prior Publication Data

US 2018/0090591 A1 Mar. 29, 2018

Related U.S. Application Data

(63) Continuation of application No. 15/274,598, filed on Sep. 23, 2016, now Pat. No. 9,793,397.

(51) Int. Cl.
*H01L 29/51* (2006.01)
*H01L 29/78* (2006.01)
*H01L 29/66* (2006.01)
*H01L 29/49* (2006.01)

(52) U.S. Cl.
CPC ........ *H01L 29/516* (2013.01); *H01L 29/4966* (2013.01); *H01L 29/513* (2013.01); *H01L 29/6684* (2013.01); *H01L 29/66545* (2013.01); *H01L 29/78391* (2014.09)

(58) Field of Classification Search
CPC ............. H01L 29/516; H01L 29/78391; H01L 29/66545; H01L 29/4966; H01L 29/513; H01L 29/6684
See application file for complete search history.

(56) References Cited

U.S. PATENT DOCUMENTS

| 6,713,358 | B1 * | 3/2004 | Chau ................. H01L 21/28167 257/E21.193 |
| 7,041,609 | B2 | 5/2006 | Vaartstra |
| 9,293,556 | B2 | 3/2016 | Van Bentum et al. |
| 9,349,842 | B2 | 5/2016 | Schloesser et al. |

(Continued)

OTHER PUBLICATIONS

List of IBM Patents or Patent Applications Treated as Related dated May 30, 2017, 2 pages.

(Continued)

*Primary Examiner* — Su C Kim
(74) *Attorney, Agent, or Firm* — Tutunjian & Bitetto, P.C.; Vazken Alexanian

(57) ABSTRACT

A method is presented for forming a semiconductor device. The method includes forming an oxygen containing interfacial layer on a semiconductor substrate, forming a hafnium oxide layer on the interfacial layer, the hafnium oxide layer crystallizing to a non-centrosymmetric phase in a final structure, forming a first electrode containing a scavenging metal, which reduces a thickness of the interfacial layer via an oxygen scavenging reaction in the final structure, on the hafnium oxide layer, and forming a second electrode on the first electrode.

17 Claims, 6 Drawing Sheets

(56) References Cited

U.S. PATENT DOCUMENTS

| | | | |
|---|---|---|---|
| 2008/0164581 A1 | 7/2008 | Cho et al. | |
| 2010/0164016 A1* | 7/2010 | Kronholz | H01L 29/1054 257/402 |
| 2010/0320547 A1* | 12/2010 | Ando | H01L 21/28088 257/411 |
| 2013/0196515 A1* | 8/2013 | Clark | H01L 21/02068 438/763 |
| 2013/0270619 A1* | 10/2013 | Schloesser | H01L 21/28291 257/295 |
| 2016/0035856 A1 | 2/2016 | Van Bentum et al. | |
| 2016/0064228 A1 | 3/2016 | Van Bentum et al. | |
| 2016/0163821 A1 | 6/2016 | Van Bentum et al. | |

OTHER PUBLICATIONS

Salahuddin et al., "Use of Negative Capacitance to Provide Voltage Amplification for Low Power Nanoscale Devices", American Chemical Society, NANO Letters; vol. 8, No. 2; 2008. pp. 405-410.
Müller et al., "Ferroelectric Hafnium Oxide based Materials and Devices: Assessment of Current Status and Future Prospects", The Electrochemical Society, ECS Transactions; vol. 64. No. 8; 2014. pp. 159-168.

* cited by examiner

FERROELECTRIC GATE DIELECTRIC WITH SCALED INTERFACIAL LAYER FOR STEEP SUB-THRESHOLD SLOPE FIELD-EFFECT TRANSISTOR

BACKGROUND

Technical Field

The present invention relates generally to semiconductor devices, and more specifically, to methods and devices for reducing a thickness of an interfacial layer.

Description of the Related Art

In the quest for improved performance, electronic circuits are becoming denser and devices are becoming smaller. For example, the most common gate dielectric in metal-oxide semiconductor field-effect transistors (MOSFETs) has been $SiO_2$. However, as the thickness of $SiO_2$ approaches 15 Å, substantial issues appear, including large leakage currents through the gate dielectric, concerns about the long-term dielectric reliability, and difficulty of manufacture and thickness control. A solution to the problem is to use thick films of materials, such as hafnium oxide ($HfO_2$) and/or zirconium oxide ($ZrO_2$) which have a dielectric constant larger than $SiO_2$.

High-k dielectrics, such as $HfO_2$, $ZrO_2$, or $Al_2O_3$, have dielectric constants more than double the dielectric constant of $SiO_2$ (k=4) and are thus an attractive material for replacement of $SiO_2$ in transistors and capacitors. The term "high-k" denotes a dielectric having a dielectric constant of greater than $SiO_2$, preferably 7 or above. Therefore, the physical thickness of the gate dielectric can be large, while the electrical equivalent thickness relative to $SiO_2$ films can be scaled.

SUMMARY

In accordance with an embodiment of the present invention, a method is provided for forming a semiconductor device. The method includes forming an oxygen containing interfacial layer on a semiconductor substrate, forming a hafnium oxide layer on the interfacial layer, the hafnium oxide layer crystallizing to a non-centrosymmetric phase in a final structure, forming a first electrode containing a scavenging metal, which reduces a thickness of the interfacial layer via an oxygen scavenging reaction in the final structure, on the hafnium oxide layer, and forming a second electrode on the first electrode.

In accordance with an embodiment of the present invention, a method is provided for forming a semiconductor device. The method includes forming an oxygen containing interfacial layer on a semiconductor substrate, forming a hafnium oxide layer on the interfacial layer, the hafnium oxide layer crystallizing to a non-centrosymmetric phase in a final structure, forming a sacrificial layer containing a scavenging metal, which reduces a thickness of the interfacial layer via an oxygen scavenging reaction in the final structure, on the hafnium oxide layer, removing the sacrificial layer, and replacing the sacrificial layer with a metal layer.

In accordance with another embodiment of the present invention, a semiconductor device is provided. The device includes an oxygen containing interfacial layer formed on a semiconductor substrate, a hafnium oxide layer formed on the interfacial layer, the hafnium oxide layer crystallizing to a non-centrosymmetric phase in a final structure, a first electrode containing a scavenging metal, which reduces a thickness of the interfacial layer via an oxygen scavenging reaction in the final structure, on the hafnium oxide layer, and a second electrode formed on the first electrode.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
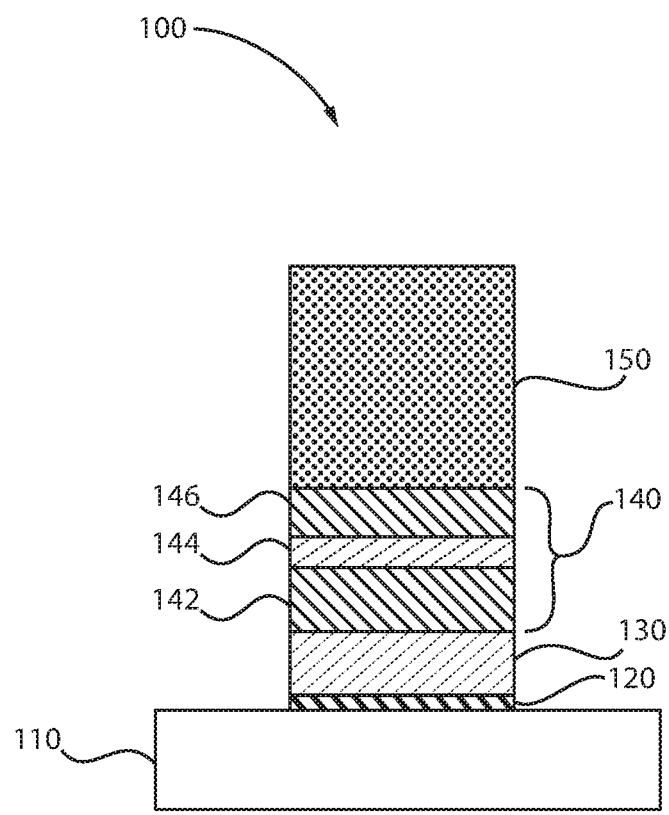
FIG. 1 is a cross-sectional view of a semiconductor device having a first electrode doped with a scavenging metal to reduce a thickness of an interfacial layer, in accordance with an embodiment of the present invention.

The present invention relates generally to the formation of a semiconductor device. The formation includes forming an oxygen containing interfacial layer on a semiconductor substrate, forming a hafnium oxide layer on the interfacial layer, the hafnium oxide layer crystallizing to a non-centrosymmetric phase in a final structure, forming a first electrode containing a scavenging metal, which reduces a thickness of the interfacial layer via an oxygen scavenging reaction in the final structure, on the hafnium oxide layer, and forming a second electrode on the first electrode.

The present invention relates generally to the formation of a semiconductor device. The formation includes forming an oxygen containing interfacial layer on a semiconductor substrate, forming a hafnium oxide layer on the interfacial layer, the hafnium oxide layer crystallizing to a non-centrosymmetric phase in a final structure, forming a sacrificial layer containing a scavenging metal, which reduces a thickness of the interfacial layer via an oxygen scavenging reaction in the final structure, on the hafnium oxide layer, removing the sacrificial layer, and replacing the sacrificial layer with a metal layer.

The present invention relates generally to a semiconductor device. The semiconductor device includes an oxygen containing interfacial layer formed on a semiconductor substrate, a hafnium oxide layer formed on the interfacial layer, the hafnium oxide layer crystallizing to a non-centrosymmetric phase in a final structure, a first electrode containing a scavenging metal, which reduces a thickness of the interfacial layer via an oxygen scavenging reaction in the final structure, on the hafnium oxide layer, and a second electrode formed on the first electrode.

In one or more embodiments, ferroelectric $HfO_2$ is considered to achieve a steep sub-threshold slope (<60 mV/decade at room temperature) FET for future low power devices. The challenge is that formation of a ferroelectric $HfO_2$ phase typically requires high temperature anneals, which result in growth of a thick interfacial layer between the semiconductor and the $HfO_2$ film. If this happens, the equivalent oxide thickness (EOT) becomes too large. The present disclosure provides a solution to simultaneously achieve a ferroelectric $HfO_2$ phase and a sufficiently thin interfacial layer.

In one or more embodiments, $HfO_2$ is doped to facilitate crystallization into a non-centrosymmetric crystalline phase. On the other hand, a first metal electrode is doped with a scavenging metal to reduce the interfacial layer thickness via a remote scavenging process.

In one or more embodiments, a ferroelectric hafnium oxide ($HfO_2$) phase and an ultra-thin $SiO_2$ interfacial layer (1-5 Angstrom) is simultaneously achieved by adapting an oxygen scavenging technique at the crystallization step for the $HfO_2$.

In one or more embodiments, interfacial layer scavenging and crystallization into a ferroelectric phase of $HfO_2$ at the same annealing step is achieved by using a TiN/M/TiN metal electrode, where "M" is a metal covering a wide ranging of scavenging metals. The metal electrode is positioned directly on top of the $HfO_2$. Additionally, an upper electrode can be positioned over the metal gate electrode. The upper electrode can include Poly-Si or Tungsten (W).

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

It is to be understood that the present invention will be described in terms of a given illustrative architecture; however, other architectures, structures, substrate materials and process features and steps/blocks can be varied within the scope of the present invention. It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a semiconductor device having a first electrode doped with a scavenging metal to reduce a thickness of an interfacial layer, in accordance with an embodiment of the present invention.

The semiconductor device 100 includes a substrate 110, an interfacial layer (IL) 120 formed directly on the substrate 110, a hafnium oxide ($HfO_2$) layer 130 formed directly on the interfacial layer 120, a first electrode 140, and a second electrode 150. The first electrode 140 can be a metal gate electrode. The first electrode 140 can include, e.g., three (3) layers. The first layer 142 can be, e.g., a TiN layer, the second layer 144 can be, e.g., a metal layer, and the third layer 144 can be, e.g., another TiN layer. The metal layer 144 can include a scavenging metal. The scavenging metal can be, e.g., one of Al, Be, Mg, Ca, Sr, Ba, Sc, Y, La, Ti, Zr, Hf, Dy, Lu, Er, Pr, or Ce. In one example embodiment, the scavenging metal is Al. The metal electrode including the three layers 142, 144, 146 can be implemented to control interfacial layer (IL) thickness during $HfO_2$ crystallization anneal, as described further below. Moreover, the $HfO_2$ layer 130 may not be doped in order to facilitate crystallization into a non-centrosymmetric crystalline phase and, instead, the first electrode 140 can be doped with a scavenging metal to reduce the thickness of the interfacial layer via a remote scavenging process.

In one example embodiment, the $HfO_2$ layer 130 can be doped, e.g., with one of Zr, Al, Ca, Ce, Dy, Er, Gd, Ge, La, Sc, Si, Sr, Sn, Y, or N. In one example, the $HfO_2$ layer 130 is doped with either Zr or Al or Si. The doped $HfO_2$ can be used as a gate insulator to obtain a ferroelectric crystalline phase. The thickness of the doped $HfO_2$ layer 130 can be, e.g., between 20-100 Angstrom. However, in certain embodiments, the $HfO_2$ may be non-doped. Thus, the $HfO_2$ can be of a non-centrosymmetric crystalline phase.

The thickness of the interfacial layer 120 can be, e.g., between 1-5 Angstrom. The second electrode 150 can be referred to as an upper electrode. The second electrode can be, e.g., Tungsten (W) or polycrystalline silicon (Poly-Si). One skilled in the art may contemplate using a number of different materials to form the semiconductor device 100.

The substrate 110 can be formed of silicon (Si), or other known semiconductor materials. The substrate 110 can have a SOI (silicon on insulator) type structure, or other known structures. In one or more embodiments, the substrate 110 can be a single crystal semiconductor. The substrate can be essentially (i.e., except for contaminants) a single element (e.g., silicon), primarily (i.e., with doping) of a single element, for example, silicon (Si).

The substrate 110 can have a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material of the substrate semiconductor layer comprises silicon, and more typically, the semiconductor material of the substrate 110 is silicon.

In case the semiconductor material of the substrate 110 is a single crystalline silicon-containing semiconductor material, the single crystalline silicon-containing semiconductor material is preferably selected from single crystalline silicon, a single crystalline silicon carbon alloy, a single crystalline silicon germanium alloy, and a single crystalline silicon germanium carbon alloy.

The semiconductor material of the substrate 110 can be appropriately doped either with p-type dopant atoms or with n-type dopant atoms. The dopant concentration of the substrate 110 can be, e.g., from $1.0\times10^{15}/cm^3$ to $1.0\times10^{19}/cm^3$, and typically from $1.0\times10^{16}/cm^3$ to $3.0\times10^{18}/cm^3$, although lesser and greater dopant concentrations are contemplated herein also. Preferably, the substrate 110 is single crystalline. The semiconductor substrate 110 can be a bulk substrate, a semiconductor-on-insulator (SOI) substrate, or a hybrid substrate. The semiconductor substrate 110 can have a built-in stress in the substrate 110. While the present invention is described with a bulk substrate, implementation of the present invention on an SOI substrate or on a hybrid substrate is explicitly contemplated herein.

The interfacial layer 120 can be formed within a film when a film forming process is performed at high temperature. Even when a high dielectric film is deposited at low temperature, the interfacial layer 120 is still formed by oxygen supplied through the high dielectric film during annealing performed later.

The material of the scavenging metal layer 144 "scavenges" impurity oxygen from neighboring metallic layers during subsequent processing. For the scavenging metal layer 144 to effectively scavenge impurity oxygen in subsequent processing steps, it is necessary that introduction of oxygen into the scavenging metal layer 144 is suppressed during the formation step. Further, it is necessary to select the material for the scavenging metal layer 144 so that the material of the scavenging metal layer 144 effectively scavenges impurity oxygen atoms from the lower metal layer 142 (e.g., TiN) and the upper metal layer 146 (e.g., TiN) to be subsequently formed.

The scavenging metal layer 144 can include a metal in an elemental form. Typical elemental metals that can be selected for the scavenging metal layer 144 include, but are not limited to, Al, Be, Mg, Ca, Sr, Ba, Sc, Y, La, Ti, Zr, Hf, Dy, Lu, Er, Pr, and Ce. In one embodiment, the scavenging metal layer 144 consists of at least one alkaline earth metal. In another embodiment, the scavenging metal layer 144 consists of at least one transition metal. In yet another embodiment, the scavenging metal layer 144 consists of a mixture of at least one alkaline earth metal and at least one transition metal. Preferably, the thickness of the scavenging metal layer 144 can be, e.g., from 0.1 nm to 3.0 nm, although lesser and greater thicknesses are also contemplated herein.

The upper metal layer 146 can be deposited directly on the top surface of the scavenging metal layer 144. The upper metal layer 146 can be formed, for example, by chemical vapor deposition (CVD), physical vapor deposition (PVD), or atomic layer deposition (ALD). Preferably, the exemplary semiconductor structure is transferred from the processing chamber that deposits the scavenging metal layer 144 to a processing chamber that deposits the upper metal layer 146 without breaking vacuum to prevent formation of any interfacial layer by oxidation or introduction of oxygen into the scavenging metal layer 144.

The thickness of the lower metal layer 142 and the upper metal layer 146 can be, e.g., from 1 nm to 100 nm, and preferably from 3 nm to 10 nm, although lesser and greater thicknesses are also contemplated herein. In one case, the lower metal layer 142 and the upper metal layer 146 are the same material (e.g., TiN). In another case, the lower metal layer 142 and the upper metal layer 146 are different materials.

In one embodiment, the polycrystalline semiconductor layer 150 is deposited directly on the top surface of the upper metal layer 146, for example, by low pressure chemical vapor deposition (LPCVD), rapid thermal chemical vapor deposition (RTCVD), or plasma enhanced chemical vapor deposition (PECVD). The polycrystalline semiconductor layer 150 can comprise polysilicon, a polycrystalline silicon germanium alloy, a polycrystalline silicon carbon alloy, or a polycrystalline silicon germanium carbon alloy. The polycrystalline semiconductor layer 150 can be formed as a doped polycrystalline semiconductor layer through in-situ doping. Alternately, the polycrystalline semiconductor layer 150 can be doped by ion implantation of dopant atoms after deposition of the polycrystalline semiconductor layer 150 and prior to patterning of a gate electrode. Yet alternately, implantation of dopant ions can be performed on a remaining portion of the polycrystalline semiconductor layer 150 after patterning of the gate electrode. The thickness of the polycrystalline semiconductor layer 150 can be, e.g., from 10 nm to 300 nm, and typically from 50 nm to 100 nm, although lesser and greater thicknesses are also contemplated herein. Embodiments are contemplated in which the polycrystalline semiconductor layer 150 is not formed and the stack of the lower metal layer 142, scavenging metal layer 144, and upper metal layer 146 constitute a gate electrode layer.

The scavenging metal layer 144 captures oxygen atoms from above and from below, i.e., the scavenging metal layer 144 captures oxygen atoms as the oxygen atoms diffuse through the polycrystalline semiconductor layer 150 and the upper metal layer 146 in the gate electrode toward the high-k gate dielectric. Because the scavenging metal layer 144 is more prone to oxide formation than the lower metal layer 142 and the upper metal layer 146, the oxygen atoms are consumed within the scavenging metal layer 144 and the oxygen atoms do not reach the $HfO_2$ layer 130. In addition, the scavenging metal layer 144 actively reduces the thickness of the IL layer 120 underneath the $HfO_2$ layer 130 as additional oxygen atoms migrate toward the $HfO_2$ layer 130 from below or from the side of the IL layer 120. Such migrating oxygen atoms are captured by the scavenging metal layer 144 instead of being incorporated into the IL layer 120. Not only growth of the IL layer 120 underneath the $HfO_2$ layer 130 is reduced, but the thickness of the IL layer 120 is reduced as a significant portion of the oxygen atoms in the IL layer 120 is consumed by the scavenging metal layer 144. Thus, the field-effect transistor maintains a constant threshold voltage even after a high temperature anneal in oxygen ambient. By reducing and limiting the thickness of the thickness of the IL layer 120 than what is normally obtainable by conventional processing, the effective oxide thickness (EOT) of a composite gate dielectric stack, which includes the IL layer 120 and the $HfO_2$ layer 130, is reduced, thereby enhancing the scalability of the composite gate dielectric stack and performance of the field-effect transistor.

Figure 2:
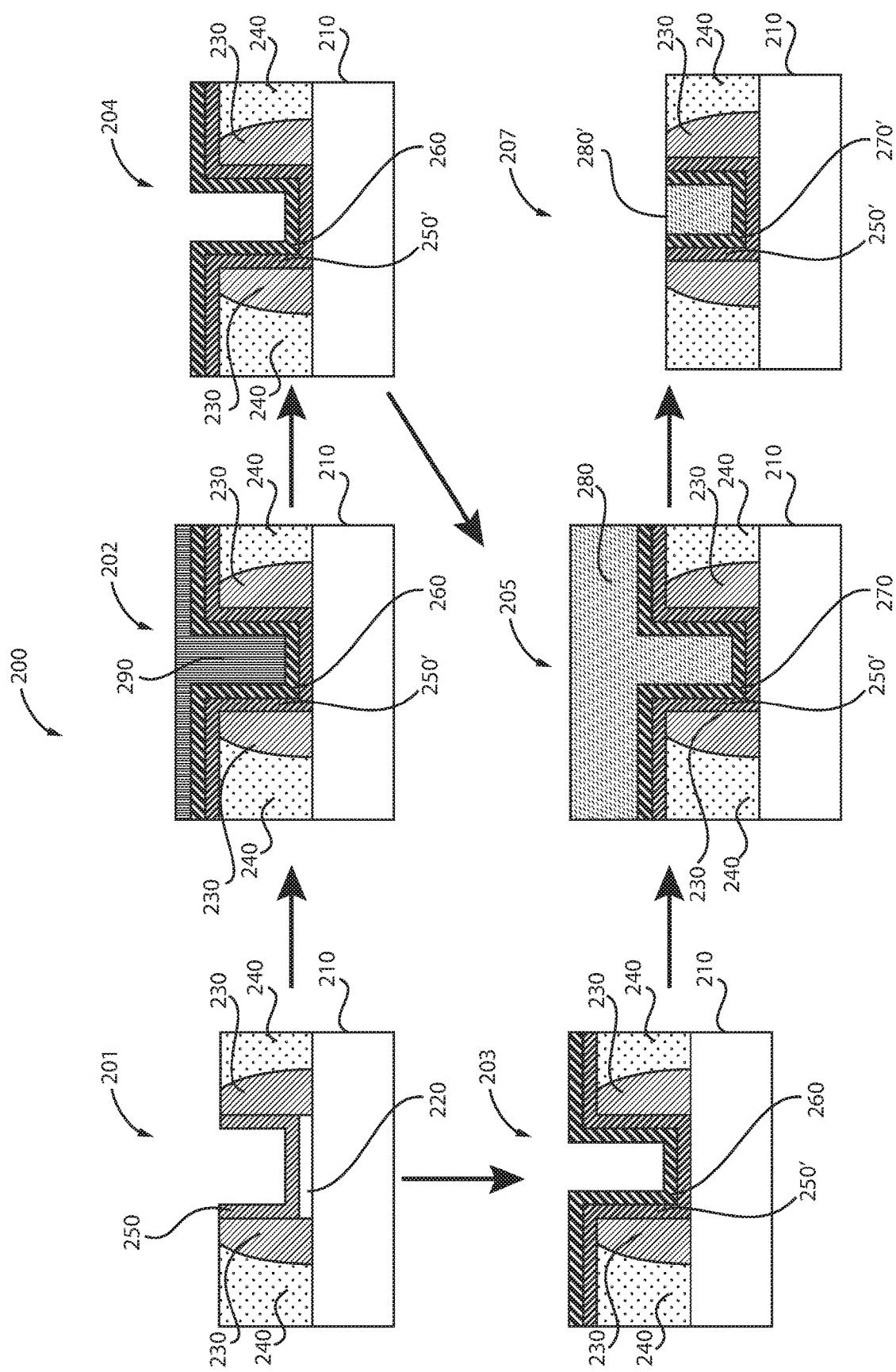
FIG. 2 is a replacement gate process architecture for a semiconductor device having the first electrode doped with a scavenging metal, in accordance with an embodiment of the present invention.

FIG. 2 is a replacement gate process architecture for a semiconductor device having the first electrode doped with a scavenging metal, in accordance with an embodiment of the present invention.

FIG. 1 above described one technique for reducing equivalent oxide thickness (EOT) by interfacial layer (IL) scavenging, in which a metal scavenging layer present in the gate stack captures oxygen atoms that diffuse, during high temperature annealing, from a bottom interface layer formed between the semiconductor substrate and the high-k dielectric layer. While such a technique is promising with respect to "gate first" high-k gate processes, such scaling has not heretofore been reported for high-k gate stacks fabricated by replacement gate processes.

With respect to FIG. 2, a replacement gate process architecture is presented which avoids issues of work function material stability seen in the "gate first" architecture. Here, a dummy gate structure is used to self-align the source and drain implant and anneals, followed by stripping out the dummy gate materials and replacing them with the high-k and metal gate materials. Although this process is more complex than a "gate first" technique, advantages of a replacement gate flow include the use of separate PMOS and NMOS metals for work function optimization.

Accordingly, it is desirable to be able to apply the benefits of IL scavenging to high-k gate replacement process flows. Existing IL scavenging techniques for "gate first" process flows are typically performed at relatively high temperatures (e.g., on the order of about 1000° C.). However, since such elevated processing temperatures can have adverse effects on structures such as completed source/drain regions, conventional IL scavenging for gate replacement IL and high-k layers can prove problematic since the source and drain regions are defined at this point. As described in further detail below, it has been recognized that processing temperatures as low as about 400° C. to 600° C. can facilitate effective IL scavenging, given certain other processing conditions.

In particular, referring back to FIG. 2, the replacement process flow 200 includes two (2) process flows indicated by the arrows. The first process flow, which includes a sacrificial Poly-Si layer, includes steps 201, 202, 204, 205, and 207. The second process flow, which does not include a sacrificial Poly-Si layer, includes steps 201, 203, 205, and 207. The first process flow is implemented for anneal of greater than 600° C. (up to about 1000° C.) and the second process flow is implemented for anneal of less than 600° C. (from, e.g., 400° C. to about 600° C.).

Regarding the first process flow, in step 201, a hafnium oxide ($HfO_2$) layer 210 includes an interfacial layer (IL) 220 thereon. The IL layer 220 has a high-k dielectric material 250 applied thereon, such that sidewalls of the high-k dielectric material 250 are adjacent spacers 230. The spacers 230 can be, e.g., SiN. The spacers 230 can be surrounded by an interlayer dielectric 240, such as, e.g., $SiO_2$.

The spacers 230 are formed, for example, by deposition of a conformal dielectric material layer (e.g., an oxygen-impermeable material such as SiN) followed by an anisotropic ion etching. The portions of the dielectric material layer 250 that are formed directly on the sidewalls of the dummy gate structure remain after the anisotropic etch to constitute the sidewall spacers 230.

The high-k dielectric layer 250 can be formed by methods well known in the art including, for example, chemical vapor deposition (CVD), ALD, molecular beam deposition (MBD), pulsed laser deposition (PLD), liquid source misted chemical deposition (LSMCD), etc. In one example embodiment, the dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from, e.g., 0.5 to 3 and each value of y is independently from, e.g., 0 to 2. The thickness of the high-k dielectric layer can be, e.g., from 1 nm to 10 nm, and preferably from 1.5 nm to 3 nm. The high-k dielectric layer can have an effective oxide thickness (EOT) on the order of, or less than, e.g., 1 nm.

In step 202, a doped metal layer 260 is applied to the high-k dielectric layer 250', such that the doped metal layer 260 assumes the shape of the high-k dielectric layer 250'. Then Poly-Si material 290 fills the gap or recess defined by the doped metal layer 260. The high-k dielectric layer 250' of step 202 is different than the high-k dielectric layer 250 of step 201 in that the high-k dielectric layer 250' extends over the top portions of the spacers 230 and the interlayer dielectric 240.

The doped metal layer 260, while depicted as a single layer for illustrative purposes, can further include first and second metallic compound layers that surround a scavenging metal layer (FIG. 1). The material of the first and second metallic compound layers can include a conductive transition metal nitride or a conductive transition metal carbide. For example, the metallic compound layers can be selected from the group of TiN, TiC, TaN, TaC, and combinations thereof. As used herein, transition metals include elements from Group 3B, 4B, 5B, 6B, 7B, 8B, 1B, and 2B and lanthanides and actinides in the periodic table of elements. In one example, the first metallic compound layer and the second metallic compound layer are the same material (e.g., TiN; see FIG. 1). In another case, the first metal compound layer and the second metal compound layer are different materials.

The scavenging metal layer portion of the doped metal layer 260 is selected so as to "scavenge" impurity oxygen from neighboring metallic layers during subsequent processing, and can include a metal such as, but not limited to: Al, Be, Mg, Ca, Sr, Ba, Sc, Y, La, Ti, Zr, Hf, Dy, Lu, Er, Pr, and Ce. In one embodiment, the scavenging metal layer portion of the doped metal layer 260 includes at least one alkaline earth metal. In another embodiment, the scavenging metal layer portion of the doped metal layer 260 includes at least one transition metal. In yet another embodiment, the scavenging metal layer portion of the doped metal layer 260 includes a mixture of at least one alkaline earth metal and at least one transition metal.

In step 202, a sacrificial layer 290, such as amorphous or polycrystalline silicon, for example, is formed over the doped metal layer 260 by CVD. The process by which the sacrificial layer is formed initiates, in this embodiment, IL scavenging of oxygen atoms. Previously, IL scavenging was performed at elevated temperatures of about 1000° C., which has heretofore limited the scavenging to gate first process flows. However, by performing the sacrificial layer at a deposition temperature of about 400° C. to about 600° C., scavenging of the IL layer 220 takes place. In addition, it will be noted that the scavenging doped metal layer 260 actively reduces the thickness of the IL layer 220 underneath.

In step 204, the sacrificial layer 290 is removed in preparation of metal gate electrode formation. In step 205, the doped metal layer 260 is also removed. Following the removal of the doped metal layer 260, step 205 illustrates deposition of a work function (WF) setting metal 270 that assumes the shape of the high-k dielectric material 250'. The WF setting metal 270 can be, e.g., an Al-containing alloy for nFETs and TiN for pFETs. A fill metal 280 is then applied onto the WF setting metal 270 such that the gap or recess defined by the WF setting metal 270 is filled with the fill metal 280.

The "work function" (WF) is generally described as the energy, usually measured in electron volts, needed to remove an electron from the Fermi level to a point immediately outside the solid surface or the energy needed to move an electron from the Fermi level into vacuum. WF is a material property of any material, whether the material is a conductor, semiconductor, or dielectric. For a metal, the Fermi level lies within the conduction band, indicating that the band is partly filled. For an insulator, the Fermi level lies within the band gap, indicating an empty conduction band; in the case, the minimum energy to remove an electron is about the sum of half the band gap and the electron affinity. An effective work function (eWF) is defined as the WF of metal on the dielectric side of a metal-dielectric interface.

The WF of a semiconductor material can be altered by doping the semiconductor material. For example, undoped polysilicon has a work function of about 4.65 eV, whereas polysilicon doped with boron has a work function of about 5.15 eV. When used as a gate electrode, the WF of a semiconductor or conductor directly affects the threshold voltage of the transistor.

The WF is a key parameter for setting the threshold voltage (Vth) of the CMOS device, whether an n-type FET or a p-type FET. In order to obtain a good electrical control of the FET devices, the WF value should be close to the valence band of the semiconductor for a pFET and close to the conduction band of the semiconductor for an nFET, and more particularly, 5.2 eV and 4.0 eV, respectively for the pFET and nFET in the case of silicon.

Such WF setting metal layers can include, for example, optional layers of about 10 Å to about 30 Å thick titanium nitride and about 10 Å to about 30 Å thick tantalum nitride, followed by a non-optional about 10 Å to about 40 Å thick layer of titanium aluminum, which together make up a WF setting metal layer portion of the metal gate material stack. Alternatively, titanium aluminum nitride, tantalum aluminum, tantalum aluminum nitride, hafnium silicon alloy, hafnium nitride, or tantalum carbide can be used in the WF setting metal layer portion in lieu of the titanium aluminum.

Regardless of the specific WF setting metal layers used in either an nFET or a pFET device, the remainder of the metal gate material stack can include a fill metal 280 such as aluminum, titanium-doped aluminum, tungsten or copper to result in the metal gate material stack.

In step 207, the structure is planarized, such as by chemical mechanical polishing (CMP) to define a "gate last" or gate replacement transistor device. From this point, existing processing techniques (e.g., silicide contact formation for gate, source and drain terminals, upper level wiring formation, etc.) may continue. The planarization results in removal of top portions of the high-k dielectric material layer 250', the WF setting metal 270, and the fill metal 280, thus resulting in sidewalls for the high-k dielectric material layer 250', sidewalls 270' of the WF setting metal, and a portion 280' of the fill metal within the recess of the WF setting metal.

Regarding the second process flow, the process commences from step 201, described above and moves to step 203. As noted, the second process flow does not include the application of a sacrificial Poly-Si. In step $_2O_3$, a doped metal layer 260 is applied to the high-k dielectric layer 250', such that the doped metal layer 260 assumes the shape of the high-k dielectric layer 250'. Next, the doped metal layer 260 is removed. Following the removal of the doped metal layer 260, the process flows back to steps 205 and 207 described above, where step 205 illustrates deposition of a work function (WF) setting metal 270 that assumes the shape of the high-k dielectric material 250', as well as deposition of a fill metal 280 applied onto the WF setting metal 270 such that the gap or recess defined by the WF setting metal 270 is filled with the fill metal 280. In step 207, the structure is planarized by CMP, as described above.

Therefore, two flows (e.g., with and without sacrificial Poly-Si) are used depending on the anneal temperature for hafnium oxide crystallization.

Figure 3:
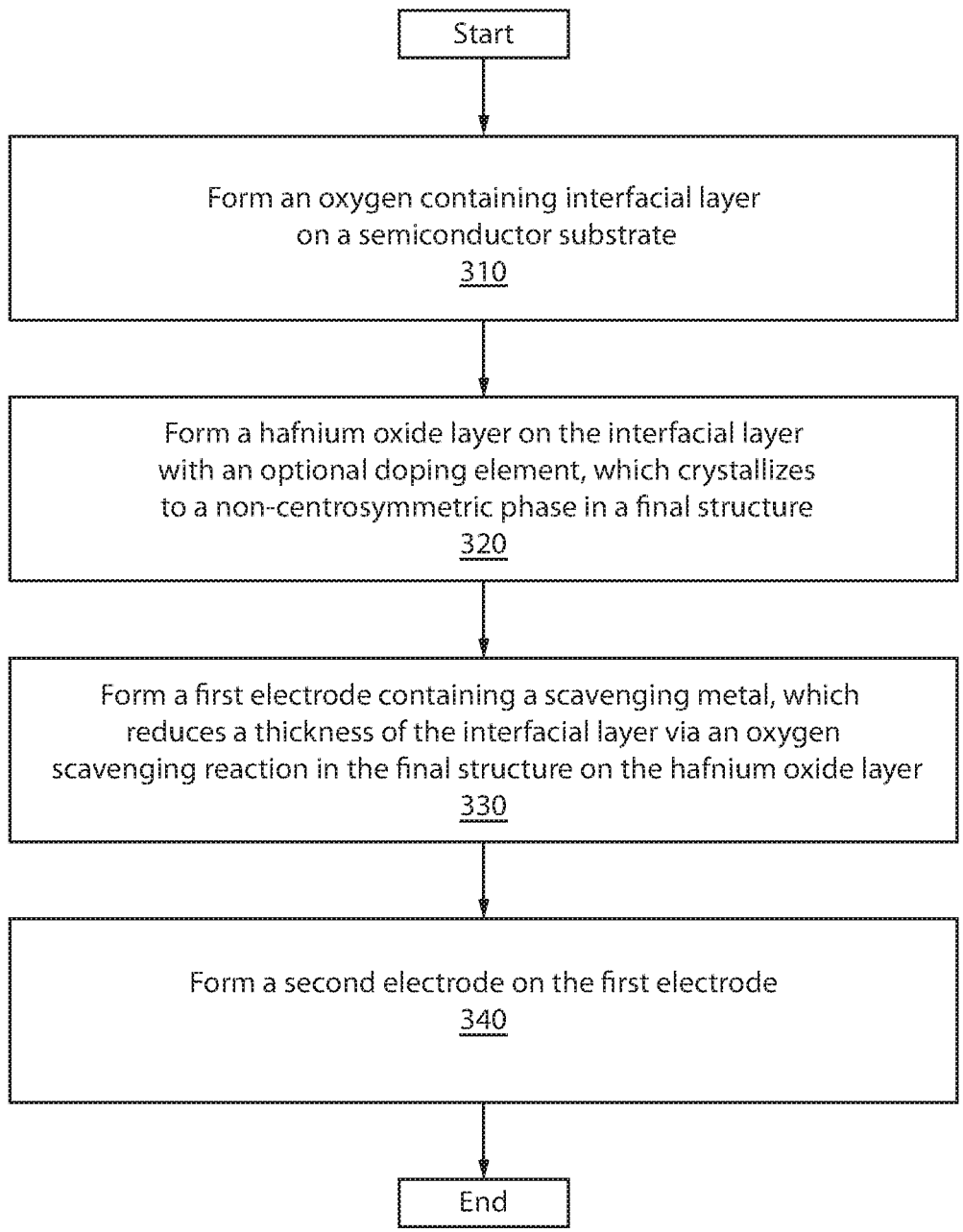
FIG. 3 is a block/flow diagram of an exemplary method for forming a semiconductor device with a metal gate electrode, in accordance with an embodiment of the present invention.

FIG. 3 is a block/flow diagram of an exemplary method for forming a semiconductor device with a metal gate electrode, in accordance with an embodiment of the present invention.

At block 310, an oxygen containing interfacial layer is formed on a semiconductor substrate.

At block 320, a hafnium oxide layer is formed on the interfacial layer with an optional doping element, which crystallizes to a non-centrosymmetric phase in the final structure.

At block 330, a first electrode is formed containing a scavenging metal, which reduces a thickness of the interfacial layer via an oxygen scavenging reaction in the final structure on the hafnium oxide layer.

At block 340, a second electrode is formed on the first electrode.

Figure 4:
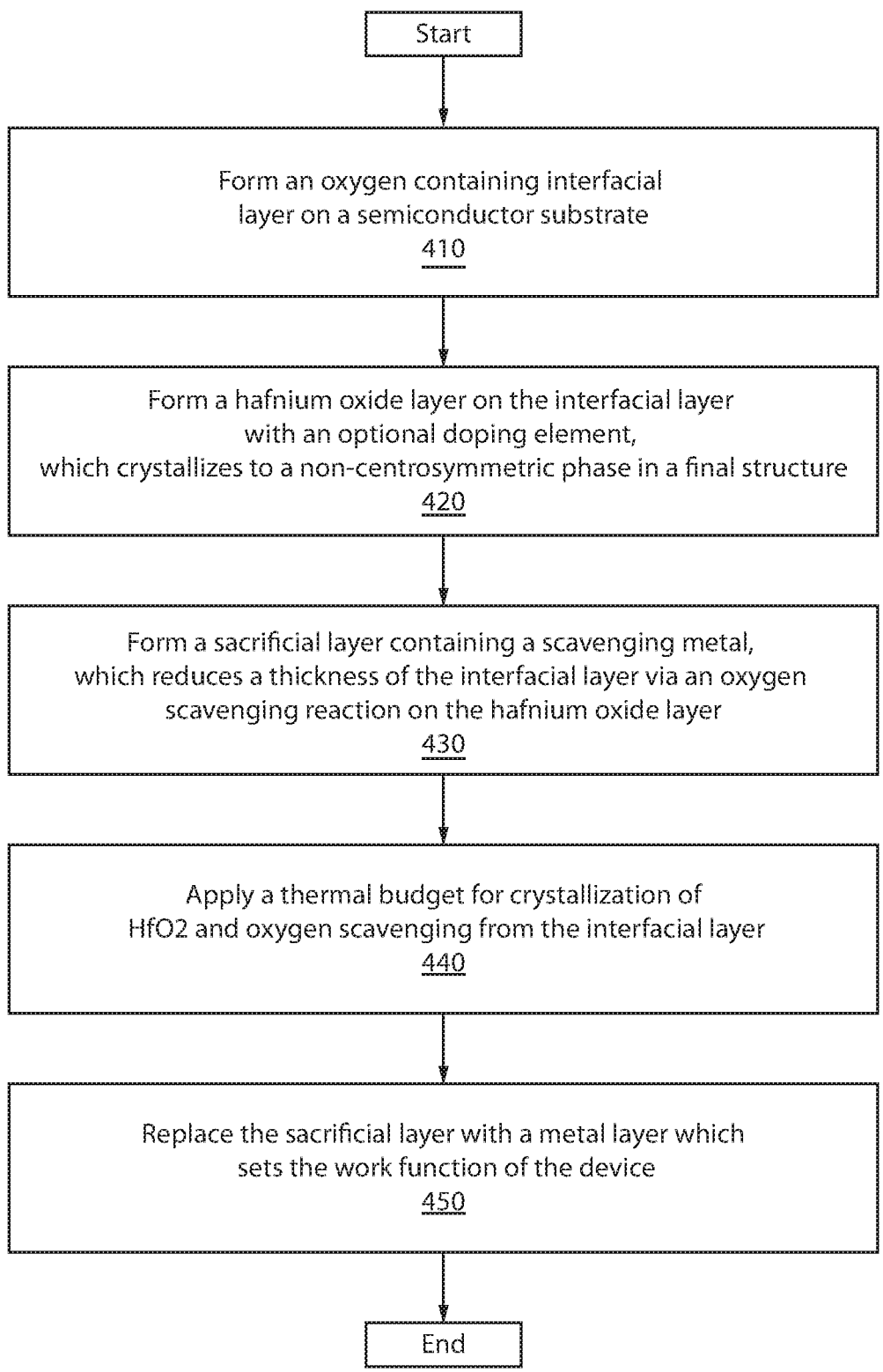
FIG. 4 is a block/flow diagram of an exemplary method for forming a semiconductor device via removal of a sacrificial layer, in accordance with an embodiment of the present invention.

FIG. 4 is a block/flow diagram of an exemplary method for forming a semiconductor device via removal of a sacrificial layer, in accordance with an embodiment of the present invention.

At block 410, an oxygen containing interfacial layer is formed on a semiconductor substrate.

At block 420, a hafnium oxide layer is formed on the interfacial layer with an optional doping element, which crystallizes to a non-centrosymmetric phase in the final structure.

At block 430, a sacrificial layer is formed containing a scavenging metal, which reduces a thickness of the interfacial layer via an oxygen scavenging reaction at the next step, on the hafnium oxide layer.

At block 440, a thermal budget is applied for crystallization of $HfO_2$ and oxygen scavenging from the interfacial layer.

At block 450, the sacrificial layer is replaced with a metal layer which sets the work function of the device.

Figure 5:
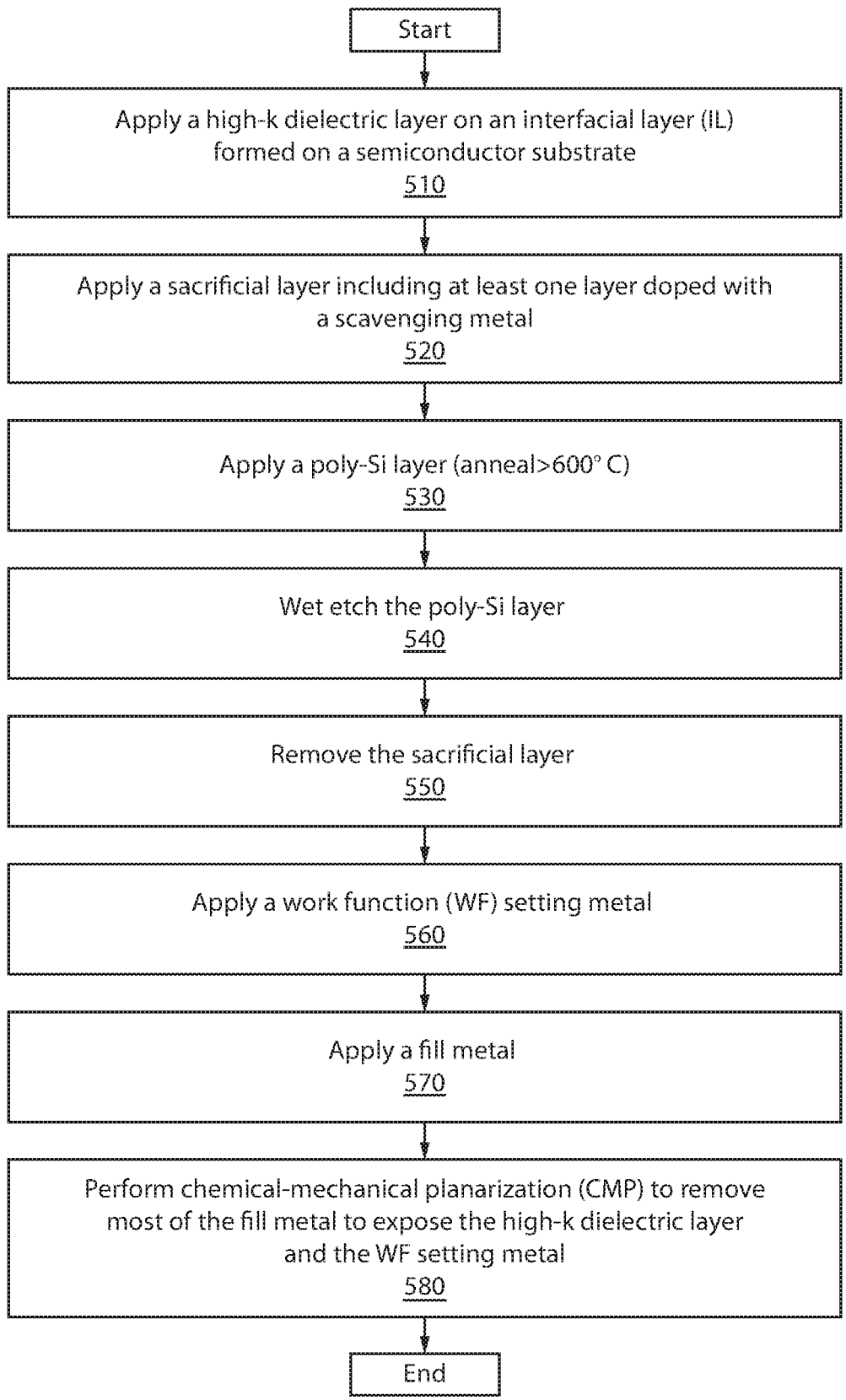
FIG. 5 is a block/flow diagram of an exemplary method for forming a semiconductor device by applying a polycrystalline silicon (Poly-Si) layer during anneal, in accordance with an embodiment of the present invention.

FIG. 5 is a block/flow diagram of an exemplary method for forming a semiconductor device by applying a polycrystalline silicon (Poly-Si) layer during anneal, in accordance with an embodiment of the present invention.

At block 510, a high-k dielectric layer is applied on an interfacial layer (IL) formed on a semiconductor substrate.

At block 520, a sacrificial layer is applied including at least one layer doped with a scavenging metal.

At block 530, a Poly-Si layer (anneal>600° C.) is applied.

At block 540, the Poly-Si layer is wet etched.

At block 550, the sacrificial layer is removed.

At block 560, a work function (WF) setting metal is applied.

At block 570, a fill metal is applied.

At block 580, a chemical-mechanical planarization (CMP) is performed to remove most of the fill metal to expose the high-k dielectric layer and the WF setting metal.

Figure 6:
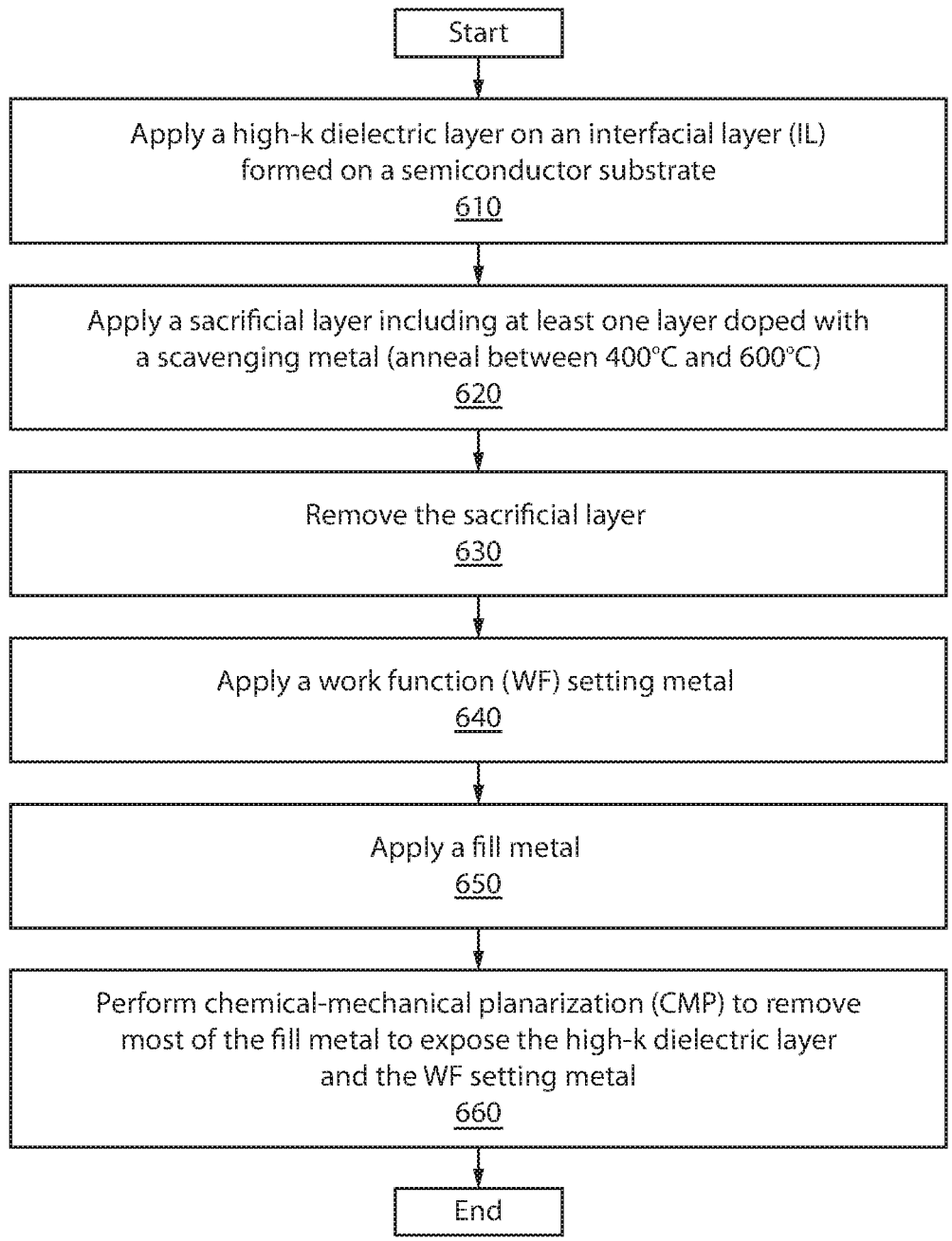
FIG. 6 is a block/flow diagram of an exemplary method for forming a semiconductor device without applying a polycrystalline silicon (Poly-Si) layer during anneal, in accordance with an embodiment of the present invention.

FIG. 6 is a block/flow diagram of an exemplary method for forming a semiconductor device without applying a polycrystalline silicon (Poly-Si) layer during anneal, in accordance with an embodiment of the present invention.

At block 610, a high-k dielectric layer is applied on an interfacial layer (IL) formed on a semiconductor substrate.

At block 620, a sacrificial layer is applied including at least one layer doped with a scavenging metal (anneal between 400° C. and 600° C.).

At block 630, the sacrificial layer is removed.

At block 640, a work function (WF) setting metal is applied.

At block 650, a fill metal is applied.

At block 660, a chemical-mechanical planarization (CMP) is performed to remove most of the fill metal to expose the high-k dielectric layer and the WF setting metal.

In one or more embodiments, the IL layer has a thickness of about 1-5 Å, which results in a high-k gate dielectric structure having a $T_{inv}$ of less than about 13 Å. Moreover, such a result is seen at scavenging processing temperatures of about 600° C. or less, which is compatible with gate replacement process flows where elevated temperatures can have adverse effects on previously formed source and drain regions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be understood that the present invention will be described in terms of a given illustrative architecture; however, other architectures, structures, substrate materials and process features and steps/blocks may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present invention. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing a thickness of an interfacial layer (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
    an oxygen containing interfacial layer formed over a substrate, the oxygen containing interfacial layer having a thickness between about 1 Å to about 5 Å;
    a hafnium oxide layer formed over the interfacial layer to obtain a ferroelectric crystalline phase, the hafnium oxide layer having a thickness between about 20 Å to about 100 Å, and crystallizing to a non-centrosymmetric phase in a final structure;
    a common anneal phase oxygen scavenging reaction first electrode including a scavenging metal to actively reduce a thickness of the interfacial layer via an oxygen scavenging reaction as additional oxygen atoms migrate toward the hafnium oxide layer from below or from a side of the oxygen containing interfacial layer;
    a common anneal phase where the oxygen scavenging reaction scavenges the interfacial layer and the oxygen scavenging reaction obtains the ferroelectric crystalline phase of the hafnium oxide layer; and
    a second electrode formed over the first electrode.

2. The semiconductor device of claim 1, wherein the hafnium oxide layer is doped with one of Zr, Al, Ca, Ce, Dy, Er, Gd, Ge, La, Sc, Si, Sr, Sn, Y, or N.

3. The semiconductor device of claim 1, wherein the first electrode is composed of a first material layer, a second material layer, and a third material layer.

4. The semiconductor device of claim 3, wherein the first material layer is a first TiN layer, the second layer is a metal layer, and the third material layer is a second TiN layer.

5. The semiconductor device of claim 4, wherein the metal layer includes the scavenging metal.

6. The semiconductor device of claim 5, wherein the scavenging metal is one of Al, Be, Mg, Ca, Sr, Ba, Sc, Y, La, Ti, Zr, Hf, Dy, Lu, Er, Pr, or Ce.

7. The semiconductor device of claim 1, wherein the second electrode is doped poly-Si or Tungsten.

8. A semiconductor device, comprising:
    an oxygen containing interfacial layer formed over a substrate, the oxygen containing interfacial layer having a thickness between about 1 Å to about 5 Å;
    a hafnium oxide layer formed over the interfacial layer to obtain a ferroelectric crystalline phase, the hafnium oxide layer having a thickness between about 20 Å to about 100 Å, and crystallizing to a non-centrosymmetric phase in a final structure; and a scavenging metal of a common anneal phase oxygen scavenging reaction first electrode to actively reduce a thickness of the interfacial layer via an oxygen scavenging reaction as additional oxygen atoms migrate toward the hafnium oxide layer from below or from a side of the oxygen containing interfacial layer; and a common anneal phase where the oxygen scavenging reaction scavenges the interfacial layer and the oxygen scavenging reaction obtains the ferroelectric crystalline phase of the hafnium oxide layer.

9. The semiconductor device of claim 8, wherein the hafnium oxide layer is doped with one of Zr, Al, Ca, Ce, Dy, Er, Gd, Ge, La, Sc, Si, Sr, Sn, Y, or N.

10. The semiconductor device of claim 8, wherein the scavenging metal is one of Al, Be, Mg, Ca, Sr, Ba, Sc, Y, La, Ti, Zr, Hf, Dy, Lu, Er, Pr, or Ce.

11. The semiconductor device of claim 8, wherein the metal layer is a work function (WF) setting metal.

12. The semiconductor device of claim 11, wherein the WF setting metal is an Al-containing alloy for an nFET.

13. The semiconductor device of claim 11, wherein the WF setting metal is TiN for a pFET.

14. A semiconductor device, comprising:

an oxygen containing interfacial layer formed over a substrate, the oxygen containing interfacial layer having a thickness between about 1 Å to about 5 Å;

a hafnium oxide layer formed over the interfacial layer, the hafnium oxide layer having a thickness between about 20 Å to about 100 Å;

a common anneal phase oxygen scavenging reaction electrode formed over the hafnium oxide layer and including a first titanium nitride (TiN) layer, a metal layer including a scavenging metal, and a second TiN layer to actively reduce a thickness of the interfacial layer via an oxygen scavenging reaction as additional oxygen atoms migrate toward the hafnium oxide layer from below or from a side of the oxygen containing interfacial layer;

a common anneal phase where the oxygen scavenging reaction scavenges the interfacial layer and the oxygen scavenging reaction obtains the ferroelectric crystalline phase of the hafnium oxide layer; and a doped poly-Si electrode formed over the common anneal phase oxygen scavenging reaction electrode.

15. The semiconductor device of claim 14, wherein the scavenging metal reduces a thickness of the interfacial layer via the oxygen scavenging reaction.

16. The semiconductor device of claim 15, wherein the scavenging metal is one of Al, Be, Mg, Ca, Sr, Ba, Sc, Y, La, Ti, Zr, Hf, Dy, Lu, Er, Pr, or Ce.

17. The semiconductor device of claim 14, wherein the hafnium oxide layer is doped with one of Zr, Al, Ca, Ce, Dy, Er, Gd, Ge, La, Sc, Si, Sr, Sn, Y, or N.

* * * * *